(12) United States Patent
Calí et al.

(10) Patent No.: US 6,909,328 B2
(45) Date of Patent: Jun. 21, 2005

(54) DEVICE FOR CONVERTING A DIFFERENTIAL SIGNAL TO A SINGLE SIGNAL

(75) Inventors: Giovanni Calí, Catania (IT); Roberto Pelleriti, Catania (IT); Felice Torrisi, Lentini (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 4 days.

(21) Appl. No.: 10/463,010

(22) Filed: Jun. 17, 2003

(65) Prior Publication Data

US 2003/0231063 A1 Dec. 18, 2003

(30) Foreign Application Priority Data

Jun. 17, 2002 (IT) ...................................... MI2002A1336

(51) Int. Cl.[7] ................................................ H03F 3/45
(52) U.S. Cl. ..................................... 330/301; 330/252
(58) Field of Search ............................... 330/252, 254, 330/301, 311

(56) References Cited

U.S. PATENT DOCUMENTS

| | | | | |
|---|---|---|---|---|
| 4,607,232 A | * | 8/1986 | Gill, Jr. ........................ | 330/261 |
| 4,959,622 A | * | 9/1990 | Kearney ....................... | 330/311 |
| 5,311,144 A | | 5/1994 | Grasset ........................ | 330/257 |
| 5,327,100 A | * | 7/1994 | Stockstad et al. ............. | 330/255 |
| 5,406,219 A | | 4/1995 | Lou ............................ | 330/257 |

FOREIGN PATENT DOCUMENTS

EP         0 353 742        2/1990

OTHER PUBLICATIONS

T.D. Towers, "Balanced Transistor D.C. Amplifiers: How Modern Diffused Silicon Transistors and F.E. Ts Are Used To Amplify D.C. Low–Level Currents and Voltages", Wireless World, IPC Business Press Ltd., vol. 74, No. 1394, Aug. 1968, pp. 269–274, XP001127064.

European Search Report dated Mar. 30, 2004 for European Application No. 03076840.

* cited by examiner

*Primary Examiner*—Khanh V. Nguyen
(74) *Attorney, Agent, or Firm*—Lisa K. Jorgenson; Jose Gutman; Fleit, Kain, Gibbons, Gutman, Bongini & Bianco P.L.

(57) ABSTRACT

A device converts a differential signal (Vin1, Vin2) to a single signal (Vout). The device includes at least one pair of transistors (Q1, Q2) having equal transconductance gain (gm) and arranged according a differential stage configuration. The transistors (Q1, Q2) have the differential signal (Vin1, Vin2) in input at the drivable terminals, have first non drivable terminals coupled respectively to first terminals of a first (R1) and a second (Rout) passive elements having second terminals connected with a first supply voltage (VDD), second non drivable terminals coupled to a second supply voltage (VEE) lower than the first supply voltage (VDD). The first terminal of the second passive element (Rout) is the output terminal (OUT) of the device. The last includes a transistor (Q3) having a first non drivable terminal connected with the output terminal (OUT) of the device, a second non drivable terminal coupled with the second supply voltage (VEE) and the drivable terminal connected with the first terminal of the first passive element (R1). The further transistor (Q3) has such a transconductance gain (gm3) that the product of the transconductance gain (gm3) by the first passive element (R1) is unitary.

8 Claims, 3 Drawing Sheets

US 6,909,328 B2

DEVICE FOR CONVERTING A DIFFERENTIAL SIGNAL TO A SINGLE SIGNAL

CROSS-REFERENCE TO RELATED APPLICATION

This application is based upon and claims priority from prior Italian Patent Application No. MI2002A 001336, filed on Jun. 17, 2002, the entire disclosure of which is herein incorporated by reference.

BACKGROUND OF THE INVENTION

1. Field of the Invention

The present invention relates to electronic devices, and more particularly to a device for converting a differential signal to a single signal.

2. Description of the Related Art

In the field of radio frequency circuits, in particular, and in many other fields, devices adapted to convert a differential signal to a single signal are commonly employed. This occurs because in integrated circuits, which typically have a single output signal, it is necessary to work with differential signals since the single signal circuit structures can exhibit isolation problems making them unusable in many instances, such as in the case of high frequency operations.

Accordingly, there exists a need for overcoming the disadvantages of the prior art as discussed above.

SUMMARY OF THE INVENTION

A device used for converting a differential signal to a single signal comprises a pair of transistors arranged in a differential stage configuration and with an active load. However this solution is used at frequencies lower than the radio frequencies and has the further disadvantage to be used for a lot of open loop applications.

The device more used is a differential stage of transistors with a resistive load and a single output, as shown in FIG. 1. The transistors Q10 and Q11 are arranged in a supply path between the voltages VDD and VEE. An input differential voltage Vin 10 is present at the base terminals and the collector terminals of the transistors Q10 and Q11 are connected with the terminals of two resistors R10, R11 connected with the supply voltage VDD. The collector terminal of the transistor Q11 is the output terminal OUT10 of the device. In such case an output voltage Vout10 will be obtained which is given by Vout10=−gm*R10/2, where gm is the transconductance gain for the transistors Q10 and Q11; the conversion from the differential signal to single signal decreases the gain of the circuit.

The circuit in FIG. 2 is the circuit equivalent of the circuit in FIG. 1 for the calculation of the common mode gain for small signal, where ZEE is the equivalent impedance of the current generator IEE which, at high frequency, is given by ZEE=2REE/(1+j2πCE*REE). It is obtained:

$$\frac{Vout10}{Vic10} = \frac{gm * R10}{1 + 2gmZEE\left(1 + \frac{1}{\beta}\right)}$$

wherein β is given by the ratio between the collector current and the base current.
Therefore the capacity CE decreases the common mode rejection at radio frequency.

In view of the art described, it is an object of the present invention to provide a device for converting a differential signal to a single signal that overcomes the aforementioned drawbacks.

According to the present invention, this object is obtained by means of a device for converting a differential signal to a single signal, said device comprising at least one pair of transistors having equal transconductance gain, which are arranged according a differential stage configuration and which have said differential signal in input at the drivable terminals, first non drivable terminals coupled respectively to first terminals of a first and a second passive elements having second terminals connected with a first supply voltage, second non drivable terminals coupled to a second supply voltage, said first supply voltage being higher than the second supply voltage and the first terminal of the second passive element being the output terminal of the device, characterized by comprising a further transistor having a first non drivable terminal connected with the output terminal of the device, a second non drivable terminal coupled with said second supply voltage and the drivable terminal connected with the first terminal of the first passive element, said further transistor having such a transconductance gain that the product of said transconductance gain by said first passive element is unitary.

Thanks to the present invention it is possible to form a device for converting a differential signal to a single signal that has a gain higher than the known devices and is not sensitive to the common mode voltages.

BRIEF DESCRIPTION OF THE DRAWING

The features and the advantages of the present invention will be made evident by the following detailed description of embodiments thereof, shown as non-limiting examples in the attached drawings, wherein.

DESCRIPTION OF THE PREFERRED EMBODIMENTS

Figure 1:
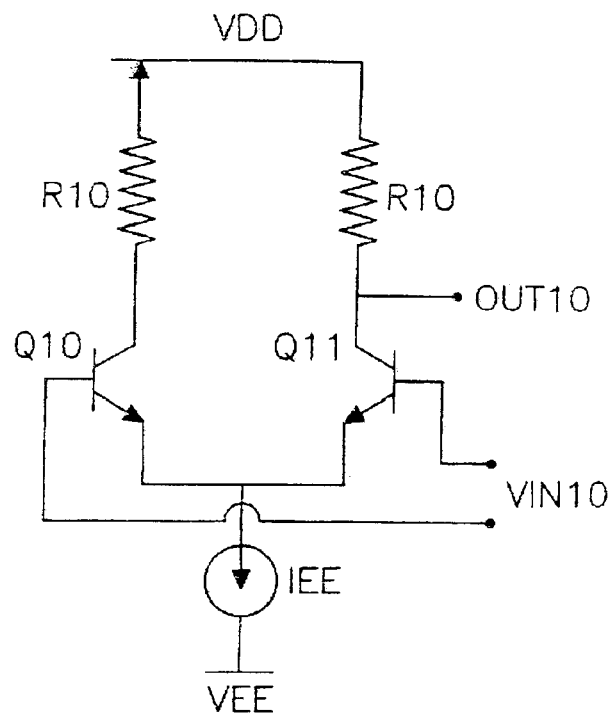
FIG. 1 is a circuit scheme of a device for converting a differential signal to a single signal according to prior art.
Figure 2:
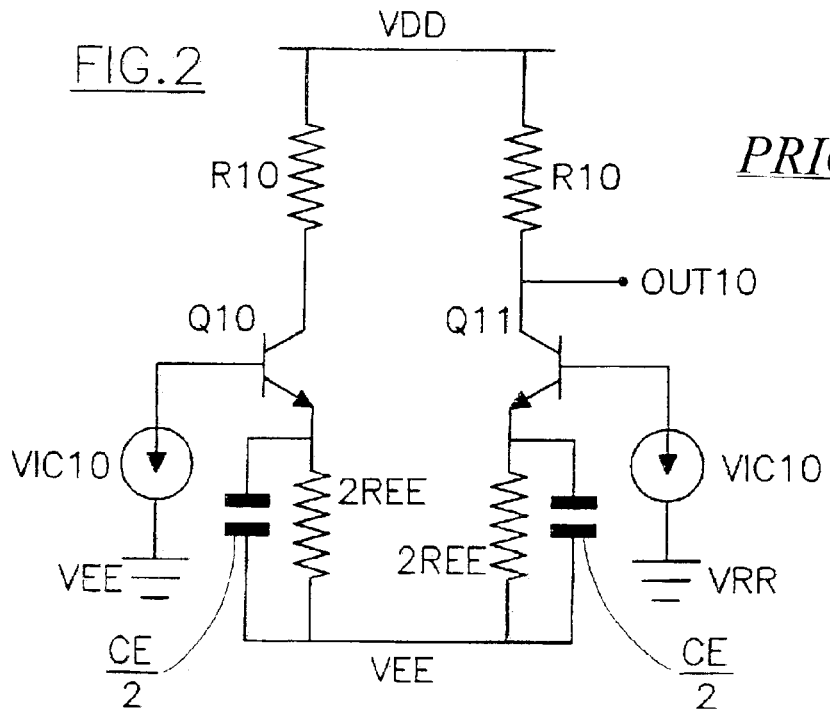
FIG. 2 is a circuit used for the calculation of the common mode gain of the circuit in FIG. 1.
Figure 3:
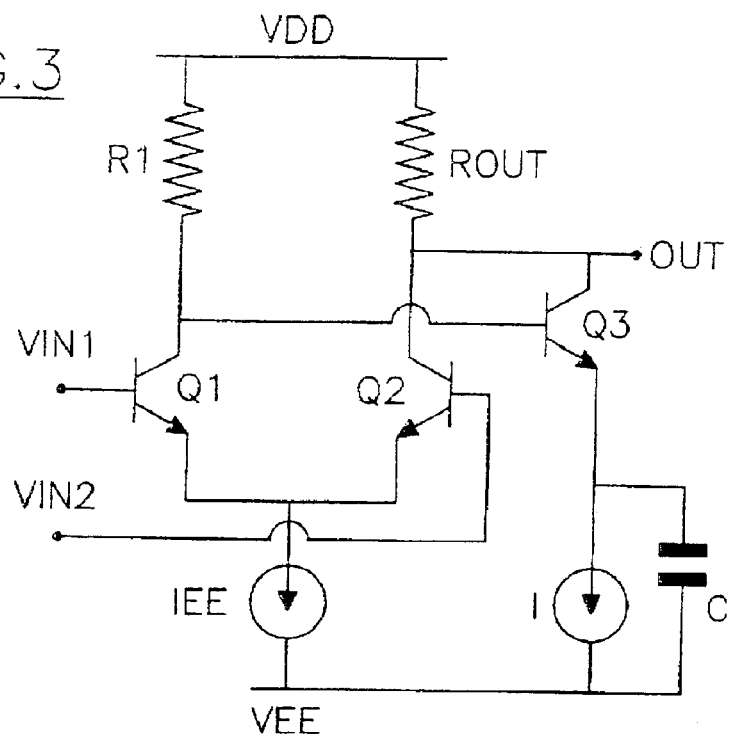
FIG. 3 is a circuit scheme of a device for converting a differential signal to a single signal according to an embodiment of the invention.

Referring to FIG. 3 a device for converting a differential signal to a single signal according to an embodiment of the present invention is described. The device comprises two transistors Q1 and Q2, for example bipolar transistors, which are arranged according a differential stage configuration with the emitter terminals connected to each other and connected with a current generator IEE connected with a supply voltage VEE, with the collector terminals connected respectively with two resistors R1 and Rout which are connected with the supply voltage VDD, and with the two base terminals driven by two voltage signals Vin1 and Vin2 which represent the input differential signal. Another transistor Q3, in such case a bipolar transistor, has the collector terminal connected with the collector terminal of the transistor Q2 which is even the output terminal OUT of the device, the base terminal coupled with the collector terminal of the transistor Q1 and the emitter terminal connected with a current generator 1 and with a capacity C which are together connected with the supply voltage VEE. The transistor Q3 has such a transconductance gain gm3 that the product of the same by the resistor R1 is unitary. The transconductance gains gm1 and gm2 of the transistors Q1 and Q2 are equal and preferably the resistors Rout and R1 have equal value.

It is possible to calculate the gain between an output voltage Vout at the terminal OUT and a input voltage Vin1, Vin2 by making the other input voltage equal to zero. Therefore by making Vin2=0 it occurs that:

$$\frac{Vout}{Vin1} = gm1R1gm3Rout$$

where gm1 is the transconductance gain of the transistor Q1 and gm3 is the transconductance gain of the transistor Q3.

By making Vin1=0 it occurs:

$$\frac{Vout}{Vin2} = -gm2Rout$$

where gm2 is the transconductance gain of the transistor Q2. Since the transconductance gains gm1 and gm2 are equal, in order that the modules of the gains Vout/Vin1 and Vout/Vin2 are equal it is necessary to have gm3R1=1. Therefore, with the device in FIG. 3 and by keeping this condition it is obtained that the gain Av of the same device is given by:

$$Av = \frac{Vout}{Vin1 - Vin2} = gmRout.$$

Figure 4:
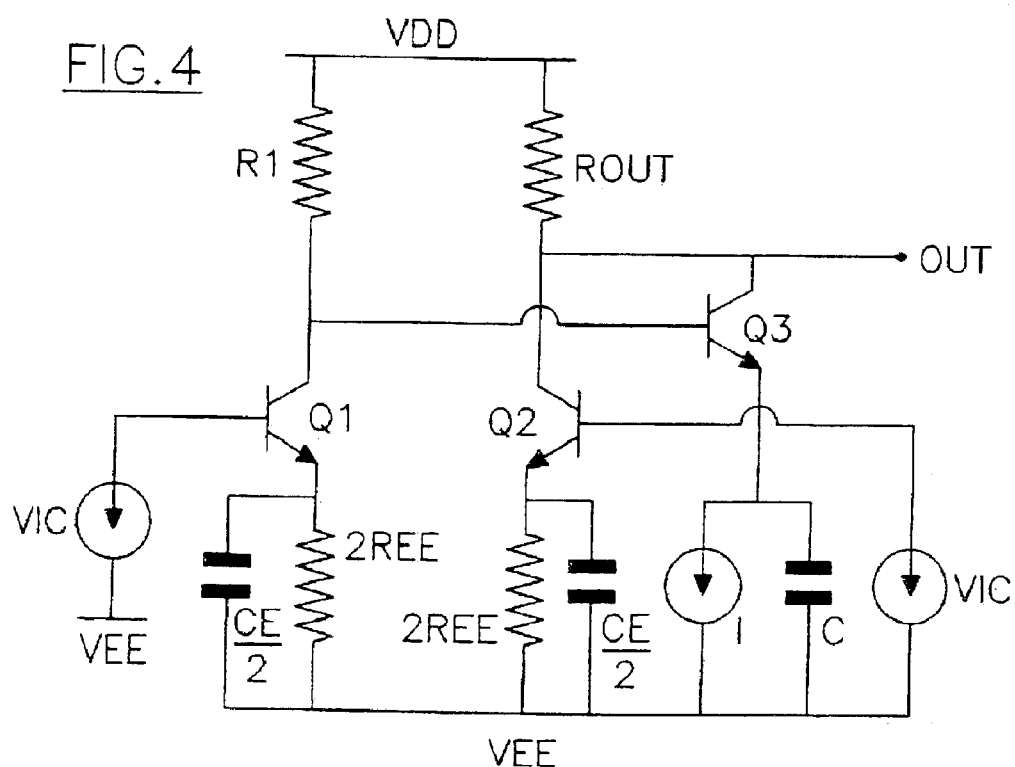
FIG. 4 is a circuit used for the calculation of the common mode gain of the circuit in FIG. 3.

In FIG. 4 a circuit scheme similar to the scheme in FIG. 3 is described for calculating the common mode gain. Considering that the common mode voltages Vc are given by Vc=(Vin1+Vin2)/2 and the impedance ZEE is the equivalent impedance of the current generator IEE that, at high frequency, is given by ZEE=2REE/(1+j2πCE*REE), it is obtained:

$$Vout = -Vic\frac{gm2Rout}{1 + 2gm2ZEE\left(1 + \frac{1}{\beta 2}\right)} + Vic\frac{gm1R1gm3Rout}{1 + 2gm1ZEE\left(1 + \frac{1}{\beta 1}\right)}$$

and because gm1=gm2=gm and β1=β2=β a common mode gain is obtained which is given by:

$$\frac{Vout}{Vic} = \frac{gmRout}{1 + 2gmZEE\left(1 + \frac{1}{\beta}\right)}(gm3R1 - 1)$$

which under the aforementioned condition, that is gm3R1=1, gives that the common mode gain is null.

Figure 5:
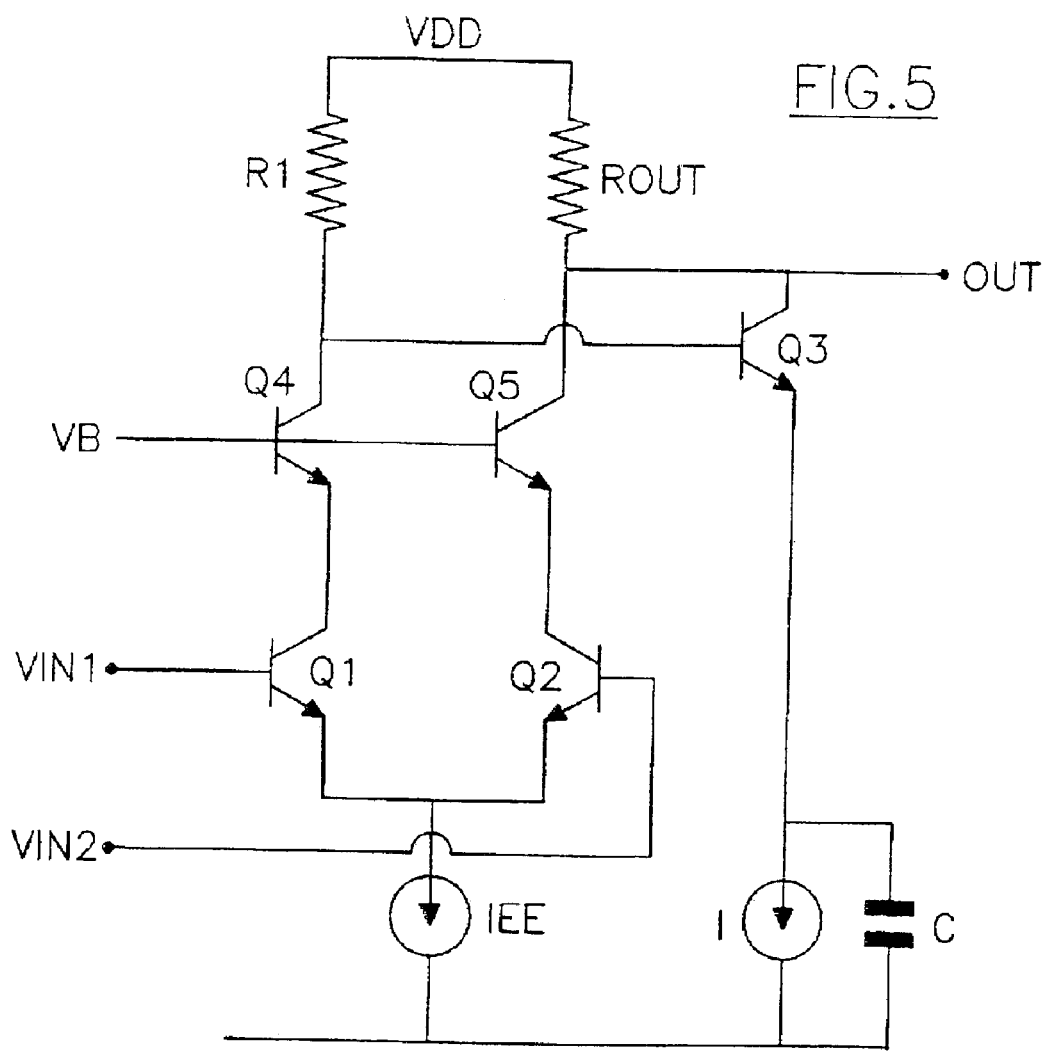
FIG. 5 is a variant of the device in FIG. 3 according a variant of the embodiment.

In FIG. 5 a variant of the device in FIG. 3 according to a variant of the embodiment is described wherein the differential stage constituted by the transistors Q1 and Q2 are made cascode by adding the transistors Q4 and Q5 arranged between the resistors R1 and Rout and the collector terminal of the transistors Q1 and Q2. More in detail the transistors Q4 and Q5 have the emitter terminals connected with the collector terminals of the transistors Q1 and Q2, the collector terminals connected with the resistors R1 and Rout and at the base terminals a biasing voltage Vb is present which allows a gain of the circuit higher than that of the circuit in FIG. 3.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A device for converting a differential signal to a single signal, the device comprising:
   at least one pair of transistors having equal transconductance gain, that are arranged according a differential stage configuration, for receiving a differential signal at drivable terminals;
   first non-drivable terminals coupled respectively to first terminals of a first and a second passive elements having second terminals connected with a first supply voltage; and
   second non-drivable terminals coupled to a second supply voltage, the first supply voltage being higher than the second supply voltage and the first terminal of the second passive element being the output terminal of the device, and comprising a further transistor having a first non-drivable terminal connected with the output terminal of the device, a second non-drivable terminal coupled with the second supply voltage and a drivable terminal connected with, and drivable from, the first terminal of the first passive element, the further transistor having such a transconductance gain that the product of the transconductance gain by the first passive element is unitary.

2. The device according to claim 1, wherein the pair of transistors is a pair of bipolar transistors having equal input resistance.

3. The device according to claim 1, wherein the further transistor is a common emitter bipolar transistor.

4. The device according to claim 1, wherein the first non-drivable terminals are connected with the first terminals of the first and second passive elements.

5. The device according to claim 1, wherein the first and second passive elements have equal value.

6. The device according to claim 1, further comprising:
   a pair of transistors that has first non-drivable terminals connected with first non-drivable terminals of the pair of transistors second non-drivable terminals connected with the first terminals of the passive elements drivable terminals connected with a biasing voltage.

7. The device according to claim 1, wherein the passive elements are resistors.

8. A circuit for converting a differential signal to a single signal, the circuit comprising:
   at least one pair of transistors having equal transconductance gain, that are arranged according a differential stage configuration, for receiving a differential signal at drivable terminals;
   first non-drivable terminals coupled respectively to first terminals of a first and a second passive elements having second terminals connected with a first supply voltage; and second non-drivable terminals coupled to a second supply voltage, the first supply voltage being higher than the second supply voltage and the first terminal of the second passive element being the output terminal of the device, and comprising a further transistor having a first non-drivable terminal connected with the output terminal of the device, a second non-drivable terminal coupled with the second supply voltage and a drivable terminal connected with, and drivable from, the first terminal of the first passive element.

* * * * *

UNITED STATES PATENT AND TRADEMARK OFFICE
CERTIFICATE OF CORRECTION

PATENT NO. : 6,909,328 B2
DATED : June 21, 2005
INVENTOR(S) : Giovanni Cali' et al.

It is certified that error appears in the above-identified patent and that said Letters Patent is hereby corrected as shown below:

<u>Title page,</u>
Item [12], change "Caliet" to -- Cali' --.
Item [75], Inventors, change "Cali" to -- Cali' --.

Signed and Sealed this

Twenty-third Day of August, 2005

JON W. DUDAS
*Director of the United States Patent and Trademark Office*